(12) United States Patent
Mason et al.

(10) Patent No.: US 6,983,136 B2
(45) Date of Patent: Jan. 3, 2006

(54) DIRECTLY TUNED FILTER AND METHOD OF DIRECTLY TUNING A FILTER

(75) Inventors: Ralph Mason, Ottawa (CA); Chris DeVries, Ottawa (CA)

(73) Assignee: Eno Semiconductor Inc., Ottawa (CA)

( * ) Notice: Subject to any disclaimer, the term of this patent is extended or adjusted under 35 U.S.C. 154(b) by 437 days.

(21) Appl. No.: 10/244,558

(22) Filed: Sep. 17, 2002

(65) Prior Publication Data

US 2003/0054783 A1    Mar. 20, 2003

(30) Foreign Application Priority Data

Sep. 17, 2001  (CA) .................................. 2357491

(51) Int. Cl.
*H04B 1/10*    (2006.01)
(52) U.S. Cl. ..................... 455/307; 455/306; 455/334; 455/226.1
(58) Field of Classification Search ............... 455/307, 455/306, 334, 183.2, 226.1, 150.1, 160.1, 455/230, 339, 179.1, 184.1, 192.3, 296, 63.1, 455/182.3; 375/227; 333/174
See application file for complete search history.

(56) References Cited

U.S. PATENT DOCUMENTS

| | | | | |
|---|---|---|---|---|
| 4,172,967 A | * | 10/1979 | Porter et al. ............. | 455/234.2 |
| 4,402,089 A | * | 8/1983 | Knight et al. ............ | 455/184.1 |
| 4,495,470 A | * | 1/1985 | Bristol .................... | 455/234.1 |
| 5,640,698 A | | 6/1997 | Shen et al. ................ | 455/323 |
| 5,945,889 A | | 8/1999 | Shanthi-Pavan et al. ... | 333/17.1 |
| 5,949,832 A | | 9/1999 | Liebetreu et al. ........... | 375/344 |
| 5,963,856 A | * | 10/1999 | Kim ............................ | 455/339 |
| 6,078,630 A | | 6/2000 | Prasanna .................... | 375/328 |
| 6,122,496 A | * | 9/2000 | Yoshioka .................... | 455/307 |
| 6,266,522 B1 | | 7/2001 | Holden et al. ............. | 455/339 |
| 6,278,866 B1 | | 8/2001 | Elder et al. ............. | 455/192.1 |
| 6,307,443 B1 | * | 10/2001 | Gabara ........................ | 333/174 |
| 6,512,803 B2 | * | 1/2003 | Heinzl et al. ................ | 455/307 |
| 6,577,854 B2 | * | 6/2003 | Hotto ......................... | 455/307 |
| 6,658,263 B1 | * | 12/2003 | Ke et al. ..................... | 455/63.1 |
| 6,683,919 B1 | * | 1/2004 | Olgaard et al. ............. | 455/63.1 |
| 6,741,636 B1 | * | 5/2004 | Lender ........................ | 375/227 |
| 2001/0049267 A1 | * | 12/2001 | Takalo et al. ............... | 455/307 |
| 2002/0181614 A1 | * | 12/2002 | Mostafa et al. ............. | 455/334 |
| 2004/0219900 A1 | * | 11/2004 | Zheng et al. ............... | 455/296 |

* cited by examiner

*Primary Examiner*—Lana Le
(74) *Attorney, Agent, or Firm*—Cassan MacLean

(57) ABSTRACT

A Method for filter tuning using direct digital sub-sampling is provided. The tuning is accomplished in the digital domain by determining the filter characteristics from the shape of the transfer function. The input signal (1) is passed through the filter (3) and is then sub-sampled by and Analog-to-digital Converter (ADC) (5). The sub-sampled signal (6) is then processed in the digital domain using a digital circuit (7) that is used to determine the center frequency (Fc) and Quality factor (Q) and/or other important filter parameters. The Fc, Q and/or other important filter parameters are then adjusted by generating digital control signals (8) that can be converted to analog signals (10) using Digital-to-analog Converters (DACs) (9).

19 Claims, 3 Drawing Sheets

DIRECTLY TUNED FILTER AND METHOD OF DIRECTLY TUNING A FILTER

FIELD OF THE INVENTION

The invention relates to the tuning of filters such as integrated circuit (IC) filters. In particular, it relates to tuning of high frequency, high Q continuous time analog filters.

BACKGROUND OF THE INVENTION

Recent research on radio frequency integrated circuits (RFICs) has focused on the development of fully integrated radio receivers. There is an ongoing search for architectures that can deliver high selectivity and sensitivity, all at low cost and power consumption. It is well understood that the super-heterodyne architecture, with a high IF frequency, although difficult to integrate, has major advantages in terms of image rejection and selectivity. A major design hurdle for integrating the super-heterodyne receiver is on chip filtering. The architecture typically requires one or more high Q filters to provide good selectivity. This has been traditionally accomplished with relatively expensive off chip ceramic or Surface Acoustic Wave (SAW) filters. Extensive research has been done in the area of active on chip filtering. Much of the work is in the area of Gm-C filtering. It has been shown that at high frequencies, the use of on-chip Q-enhanced LC filters can have an advantage over the typical Gm-C filter in terms of power and dynamic range. Q-enhanced filters are easily integrated into standard technologies and are capable of operation at very high frequencies. The Q-enhanced LC filter is also easily tunable in both frequency and Q and its circuit topology is inherently simple. Research with Q-enhanced LC filters has explored several simple prototypes and higher order filters have also been investigated.

Precise tuning of high Q integrated circuit filters is essential for their correct operation. This is difficult or impossible to achieve using manual tuning methods because manual tuning methods cannot adequately accommodate environmental variations such as temperature or power supply changes. Master-Slave tuning suffers from component mismatch and disparate circuit noise in the master and slave circuits.

Another existing method of tuning continuous time filters has been proposed in U.S. Pat. No. 5,949,832 which issued Sep. 7, 1999, in which a communications signal is decoded, and a change in the bit error rate of the decoded signal compared to previous bit error rate is used to adjust the filter bandwidth. U.S. Pat. No. 5,945,889 which issued Aug. 31, 1999, and U.S. Pat. No. 6,266,522 which issued Jul. 24, 2001 provide solutions which are principally aimed at lower frequency filters using Nyquist sampling.

SUMMARY OF THE INVENTION

Methods of directly tuning an analog filter are provided. Advantageously, the characteristics of a filter to be adjusted can be determined by amplifying and shaping the input spectrum of the filter thereby eliminating the need for an input reference frequency signal.

The present invention preferably relies on sub-sampling of the filter output which allows the system to tune higher frequency signals using lower power sub-sampling ADCs. In some embodiments, applying the filter function directly to the input signal allows the input signal to be received continuously even while the filter is being tuned. This increases the data transfer rate of the filter and adds flexibility to the overall system implementation.

One broad aspect of the invention provides a method of tuning an analog filter. The method involves: a) filtering an input signal with the analog filter to produce a filtered signal, the input signal being such that the filtered signal has a frequency response representative of that of the analog filter; b) performing analog-to-digital conversion on the filtered signal to produce filtered signal digital samples; c) processing the filtered signal digital samples to determine at least one characterizing filter parameter; and adjusting the filter based on at least one characterizing filter parameter.

In some embodiments, the method further involves providing the input signal with a substantially flat spectral density.

In some embodiments, the method further involves disconnecting a normal input to the filter, and connecting the filter to the input signal with the substantially flat spectral density.

In some embodiments, the method further involves performing amplification prior to performing analog-to-digital conversion. This may be done before or after filtering.

In some embodiments, the characterizing filter parameters comprise at least center frequency and Q.

In some embodiments, the method further involves: e) repeatedly performing steps (a) through (d) until the characterizing filter parameters satisfies at least one objective.

In some embodiments, the at least one objective comprises a respective predetermined range within which each characterizing filter parameter must fall.

In some embodiments, the method further involves: e) repeatedly performing steps (a) through (d) until the center frequency and Q satisfy at least one objective.

In some embodiments, the at least one objective comprises a respective predetermined range within which each characterizing filter parameter must fall.

In some embodiments, the method is adapted to tune the filter periodically. In this case, the method involves i) performing steps a) through e); ii) disabling the method; wherein steps i) and ii) are performed at a predetermined update rate.

In some embodiments, the method is adapted to tune the filter periodically. In this case, the method involves: i) performing steps a) through e); ii) disabling the method; wherein steps i) and ii) are performed continuously.

In some embodiments, the filter is an on-chip Q enhanced LC filter.

Another broad aspect of the invention provides a method of tuning a multi-stage analog filter. The method involves: a) setting characterizing parameters of all of filter stages of the multi-stage analog filter except one filter stage to default values; b) filtering an input signal with the multi-stage analog filter to produce a filtered signal, the input signal being such that the filtered signal has a frequency response representative of that of the multi-stage analog filter; c) performing analog-to-digital conversion on the filtered signal to produce filtered signal digital samples; d) processing the filtered signal digital samples to determine at least one characterizing filter parameter of the one filter stage; e) adjusting the one filter stage based on the at least one characterizing filter parameters; repeating steps b) through e) to adjust the characterizing filter parameters of each other filter stage.

Another broad aspect of the invention provides an apparatus having an analog filter adapted to filter an input signal to produce a filtered signal, the input signal being such that the filtered signal has a frequency response representative of that of the analog filter; an analog-to-digital converter adapted to sample the filtered signal to produce filtered signal digital samples; a digital circuit adapted to process the filtered signal digital samples to determine at least one characterizing filter parameter and to adjust the filter based on the at least one characterizing filter parameter.

In some embodiments, the apparatus has a switch for disconnecting a normal input to the filter, and connecting the filter to an input signal with a substantially flat spectral density.

In some embodiments, the apparatus has an amplifier adapted to perform amplification prior to performing analog-to-digital conversion.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
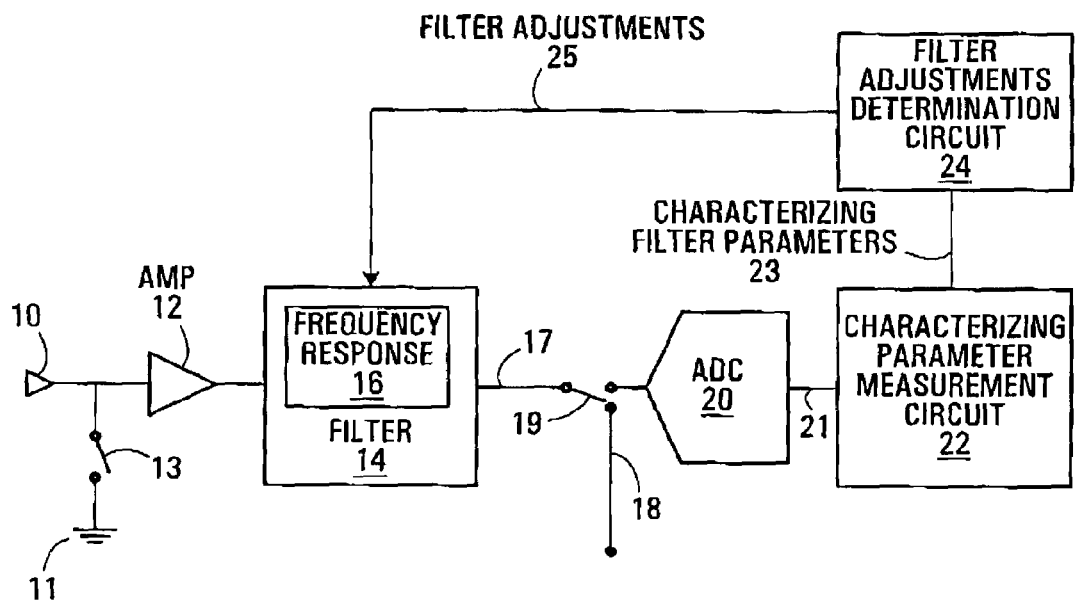
FIG. 1 is a block diagram of a filter and tuning system provided by an embodiment of the invention.

The present invention now will be described more fully with reference to the accompanying drawings, in which embodiments of the invention are shown. The invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Referring now to FIG. 1, a first example of a digitally tuned filter arrangement is shown. An input signal 10 is shown input to an amplifier 12 which is connected to an analog filter 14. The input to the amplifier (AMP) 12 can alternatively be connected to ground 11 under control of switch 13. The filter 14 has an output 17 which is connectable either to an analog-to-digital converter (ADC) 20 or to an output 18 of the arrangement under the control of a switch 19. Alternatively, if the output of the filter 14 is to be sampled in any case, then there is no need for switch 19. The output 21 of the ADC 20 is input to a digital domain characterizing parameter measurement circuit 22 which outputs characterizing filter parameters 23 to a filter adjustment determination circuit 24. The filter adjustment determination circuit 24 outputs filter adjustments 25.

The filter 14 is any analog filter requiring adjustment. The frequency response of the filter is indicated at 16. In a preferred embodiment, the filter is a bandpass filter but other transfer characteristics may be employed. It is to be understood that, in general, filters that have transfer characteristics that are adjustable may be used with the present invention. The invention is particularly suited to high frequency applications. 500 MHz and 2.4 GHz are two example center frequencies. The filter might for example be an on-chip Q enhanced LC bandpass filter.

Circuits 22,24 may be implemented in any suitable form, using for example separate general purpose or specific processors, a combined or specific general purpose processor, a DSP, ASIC, FPGA to name a few examples.

In operation, when the input to the amplifier 12 is connected to ground 11 under control of switch 13, the input to the amplifier 12 becomes a low amplitude white noise signal. This is amplified by amplifier 12 to produce an amplified signal having a substantially flat power spectral density. The amplified signal is filtered by the filter 14 to produce at the filter output 17 a signal having a power spectral density which is proportionally representative of the frequency response 16 of the filter 14.

The ADC 20 performs analog-to-digital conversion and produces an output 21 consisting of a sequence of digital samples. In a preferred embodiment, rather than performing ADC over a frequency range spanning from base band to the maximum frequency of the filter, sub-sampling is performed using an ADC operable over a range at least as large as the bandwidth of the filter 14.

The sampled signal 21 is then processed in the digital domain using the characterizing parameter measurement circuit 22. The characterizing parameter measurement circuit 22 processes the sampled signal 21 to determine the set of characterizing filter parameters 23 in respect of the filter 14.

Once the characterizing filter parameters 23 are determined, the filter adjustment determination circuit 24 decides on how best to adjust the filter such that the characterizing filter parameters satisfy objectives for the filter. In one embodiment, the filter 14 is equipped to have analog filter adjustment inputs 25 that directly adjust a respective filter element for each characterizing parameter. This may for example involve determining digital control signals that are converted to analog signals using digital-to-analog converters.

It is to be understood that the filter parameters are not totally independent and it may be necessary to have a relatively complex algorithm to adjust their values. The use of a digital tuning algorithm is therefore highly desirable. It is also to be understood that the tuning method is a form of direct tuning as the filter itself is tuned without the use of a master filter or voltage controlled oscillator (VCO). The tuning of the filter requires the digitization of the filter output. The filter amplifies and shapes the input signal to the filter transfer function. In the above described example, to facilitate direct tuning, the input signal and its potentially large unwanted spectral components are removed during tuning by using the input switch 13. More generally, some method of attenuating/removing the input signal is required. In another implementation, this can be accomplished by lowering the gain of the amplifier. The resulting frequency shaping by the filter may be amplified during tuning to give sufficient Signal-to-Noise Ratio (SNR) in the ADC 20 so that the shape can be resolved in the characterizing parameter measurement circuit 22.

It is noted that tuning of the filter at a sufficiently high update rate can help mitigate low frequency 1/f noise by resetting characterizing filter parameters consisting of Fc and Q at a regular interval. The required update depends on a given environment, and depends for example on how fast the parameters of the filter are drifting, and how accurate the filter is required to be. Other example characterizing parameters include pass-band ripple, stop-band roll-off, bandwidth, and basically any parameter that can be compared against filter objectives.

The illustrated embodiment shows an amplifier, typically a low noise amplifier (LNA) before the filter, but this is not necessarily a requirement. Such an LNA is typically included in receivers for proper reception of the signal, and is necessary to improve the sensitivity of the system in which case it does not have much to do with the actual tuning. Alternatively, or additionally, an amplifier may be provided after the filter. In respect of the tuning of the filter, the reason for the amplifier after the filter is to amplify the shaped noise from the filter so that it can be seen by the ADC (i.e. is within the ADC's Dynamic Range). In order to accomplish this, the signal will likely need to be amplified unless an ADC with a large SNR is employed (eg. 60dB or more). The noise can be amplified before going into the filter as illustrated in FIG. 1 and get the same effect, but the filter would then have to deal with a much larger signal, which is difficult for some integrated types of filters. In many cases it is better to just ground the input to the filter and have an RF or IF amplifier after the filter but before the ADC.

Figure 2:
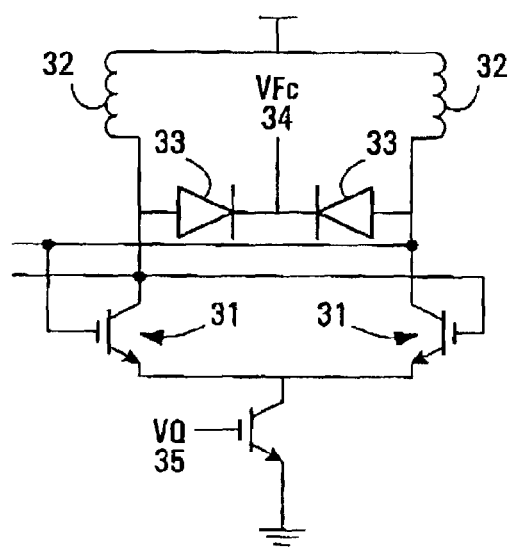
FIG. 2 is an example Q enhanced filter schematic with frequency and Q control signals.

Q enhanced LC filters typically have a transfer characteristic that is adjustable by varying the transconductance of the negative gm transconductor and the capacitance of the LC tank. This may be accomplished in a number of ways as Q enhanced LC filters may have a wide variety of configurations. A typical Q enhanced filter is illustrated in FIG. 2. In this example, the center frequency of the filter passband is dependent on the value of the inductors 32 and capacitors in the tank circuit. A well-known technique for adjusting the capacitance is to use a variable capacitance varactor 33 as the tank capacitance. Typically, the Q of the filter can be adjusted by varying the transconductance of the negative gm transconductor 31. Both of these parameters can be adjusted by varying an externally-applied control signal to control biasing point VFc 34 and VQ 35, as for example described in: Pipilos, S., Tsividis, Y. P., Fenk, J., Papananos, Y., "A Si 1.8 GHz RLC Filter with Tunable Center Frequency and Quality Factor," IEEE Journal of Solid State Circuits, vol. 31, n. 10, Oct. 1996.

Figure 3:
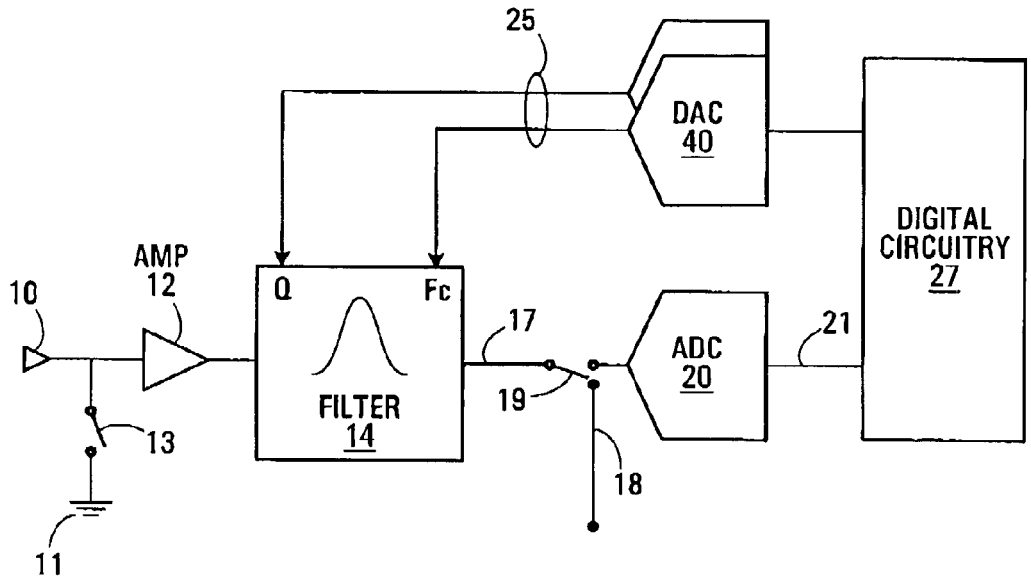
FIG. 3 is a block diagram of another filter and tuning system provided by an embodiment of the invention.

A more detailed implementation suitable for the filter of FIG. 2 for example is shown in FIG. 3 where elements which are common with FIG. 1 have been identically numbered. In this case, the filter 14 has a bandpass frequency response, characterized by characterizing filter parameters Q and center frequency Fc. The characterizing parameter measurement circuit 22 and the filter adjustment determination circuit 24 of FIG. 1 are shown implemented as a single digital circuit 27. For example, Fc may be determined by performing an FFT of the sampled data, removing the narrow band desired signal and any other interfering signals, smoothing the amplified noise if necessary and finding the peak of the resultant frequency response. A more efficient approach is to replace the FFT with programmable digital filters at know frequencies. The Q can be determined by measuring the 3 dB bandwidth of the resultant frequency response. This is one example of a method for resolving the filter parameters. Depending on speed, accuracy and power requirements other methods may be employed.

In this case, the digital circuit 27 produces digital control signals for the Q and Fc of the filter 24. Adjustments to the Q and Fc inputs are determined, and these are converted to analog control signals 25 using a pair of digital-to-analog converters (DACs) 40.

Figure 4:
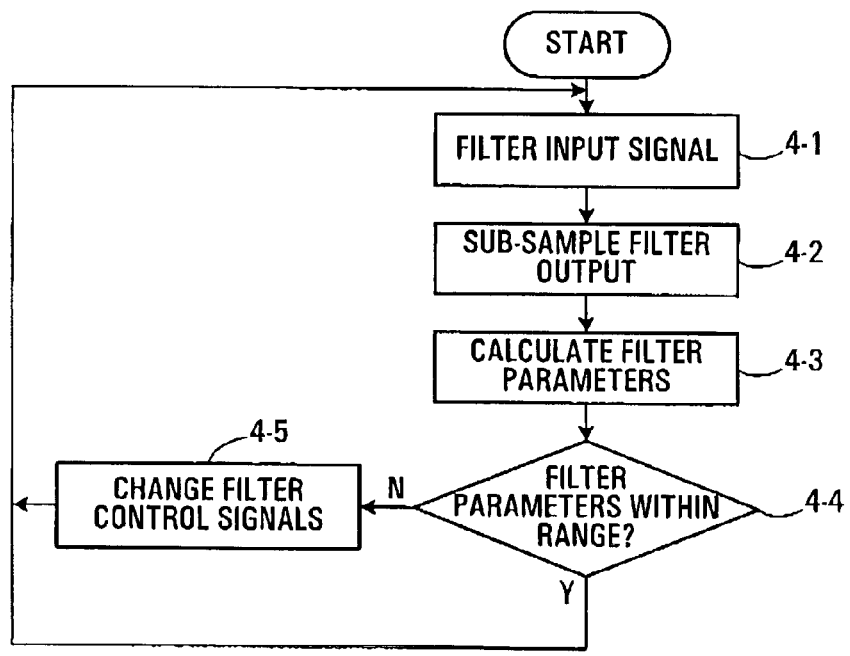
FIG. 4 is a flow diagram of a method of tuning a filter provided by an embodiment of the invention.

FIG. 4 is an example flow diagram of the tuning process in operation. When it is time to update the filter parameters, either when the filter is initially powered up, or when an update period has expired, the input is connected to the white noise source (ground) and is shaped to the filter transfer function in step 4-1. Next the filter output is sub-sampled at step 4-2, and the filter parameters, such as Fc and Q, are calculated at step 4-3. Filter parameter adjustment then takes place. In this example, this involves performing a test at step 4-4 to see if the filter parameters are within predetermined ranges. If the filter parameters are all within range (yes path step 4-4) then the tuning cycle is complete and there is a predetermined update delay, which is zero for continuous tuning, before the tuning cycle is performed again beginning at step 4-1. If the filter parameters are not within range (no path, step 4-4) then the filter control signals are adjusted at step 4-5 and the initial tuning process is begun again at step 4-1. Preferably, continuous tuning is employed until the filter parameters are all within range.

In the above described embodiment, re-tuning is triggered by a delay time or by system power up, but more generally this could also be triggered by some other event in the system. In one embodiment, the system is configured to re-tune upon detection of a reduction in the quality of the filtered signal. This quality detection may be performed in the digital circuitry.

The illustrated embodiments have assumed that the input is connected to ground so that a white noise signal is input to the amplifier and filter, and such that the filtered output has a power spectrum which is representative of that of the filter. In another embodiment, if there is sufficient knowledge of the frequency characteristics of the actual input signal (signal 10 of FIG. 1), then the frequency response of the filter can be determined using this knowledge without requiring the white noise input. This approach will allow continuous tuning during the operation of the filter.

The illustrated embodiments have involved tuning of a single filter. In another embodiment, the approach is adapted for use in a cascaded filter arrangement of two or more filter stages. In this approach, all of the filter stages are initially set to low Q (or to some other default state), then one of the filter stages is tuned using the described method. Then, tuning is performed on the subsequent filter stages in sequence.

In another embodiment, the input signal may pass through a mixer before the ADC. When the filter is implemented as part of a receiver, this would typically be the case, with a mixer being employed to bring a received RF signal into an IF band that is then filtered and analog-to-digital converted.

As indicated previously, sub-sampling in the ADC can be employed so that a reduced input bandwidth ADC is required. For this IF example, it is possible to use sub-sampling to sample the signal at a lower frequency than the carrier, provided that the sampling frequency obeys the Nyquist theorem with respect to the bandwidth of the signal. This allows the use of a low frequency sampling clock and ADC. An important consideration is that the input bandwidth of the ADC has to accommodate the high frequency IF signal. The correct conversion of the desired band depends on the following criteria:

$$kf_s < f_h, f_l < (k+1/2)f_s \text{ where } 2 < k < \frac{f_h}{f_h - f_l}$$

In the above equations, $f_s$ is the sampling frequency, $f_h$ and $f_l$ are the highest and lowest frequencies within the desired band respectively and k is an integer. The use of IF sampling allows the signal to be mixed down and processed in the digital domain, providing potentially significant power savings as well as increased flexibility in the receiver.

Noise folding or aliasing has the effect of folding 2×m noise images, where m is the over-sampling ratio, into the band of interest. By using a high Q bandpass filter at the input of the ADC this problem can be eliminated.

For example, a Q of 500 and center frequency of 500 MHz may be used. A sampling frequency of 80 MHz is chosen giving a sub-sampling ratio of 6. The largest noise images occur at +/− 40 MHz and are attenuated by 37 dB. Since these images are much larger than all other noise images, we can approximate the amount of folding by:

$$\frac{N_{folding}}{N_{in\text{-}band}} \approx 10\log(2) - 37 \text{ dB} = -34 \text{ dB}$$

which means the added noise is insignificant. Wide-band noise from the ADC sample and hold circuit is not filtered by the IF filter and so this noise will see the entire effect of the sub-sampling. In general, for a low precision ADC (i.e. limited dynamic range requirement) this noise will be much lower than the quantization noise of the converter. The sub-sampling converter will also produce images of blocking signals at each multiple of the sampling frequency.

Simulation Results

The ADC used in a test setup was a Texas Instruments TLV5580, which is an 8 bit 80 MSPS converter with an analog input bandwidth of 700 MHz. The digital tuning was accomplished using an FPGA and a PC running Matlab. A sampling frequency of 80 MSPS gives a usable tuning range of 40 MHz. This means that the filter has to be calibrated to ensure the initial frequency is within that 40 MHz range. A 1024 point 8 bit FFT was implemented in an Altera Apex20K400 FPGA using 20K gates, 4 Kbits of sin/cos ROM and 16 Kbits of RAM. The FFT is performed in 52uS using an 80 MHz clock and gives a resolution of 78 kHz.

Figure 5:
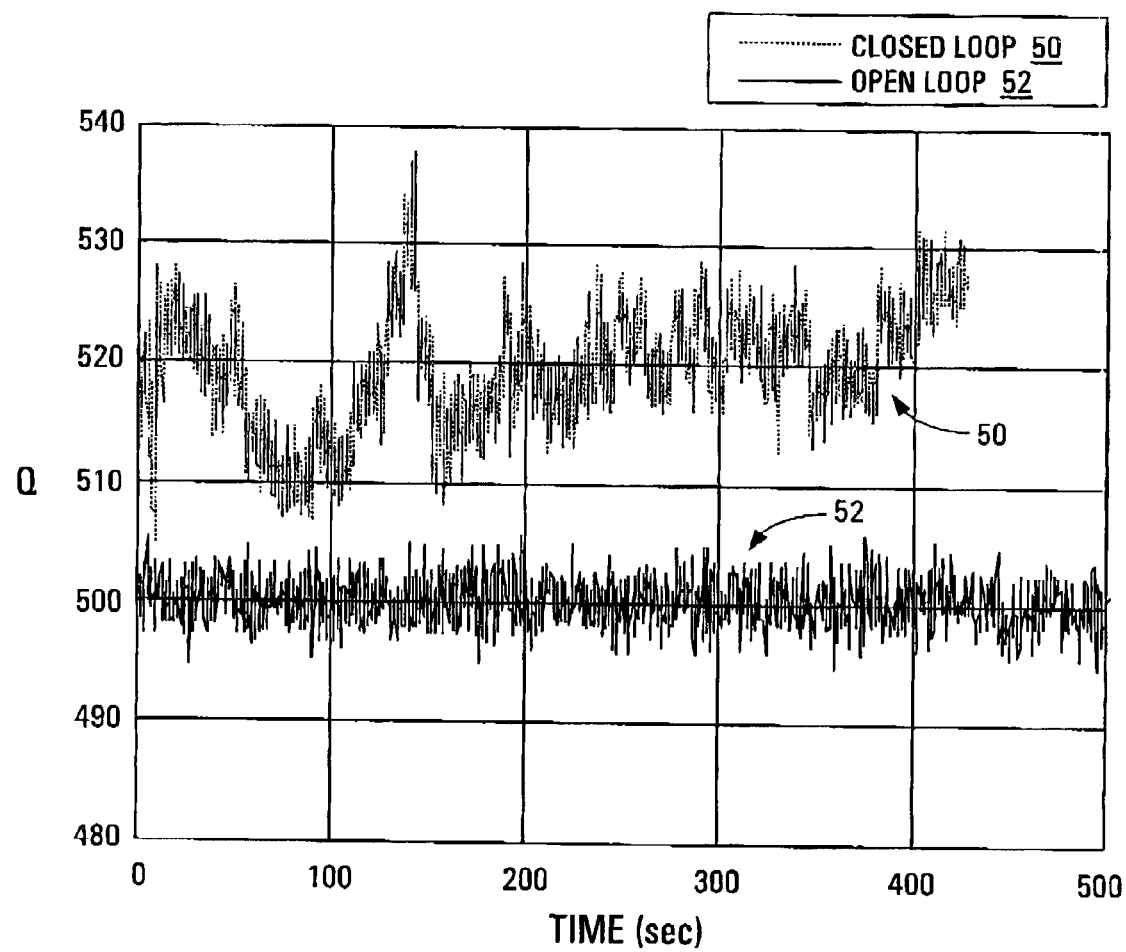
FIG. 5 is a plot of results of Q tuning over time for an example implementation.

FIG. 5 shows an example of the variations with time of a filter tuned to a Q of 500 for closed loop tuning 50 according to an embodiment of the invention, and for open loop tuning 52. The closed loop tuning includes a filter refresh tuning of the Q every 300 milliseconds. In the example the RMS value of $2^{13}$ samples are used to calculate the Q, which takes a total of 102 μs. The resulting Q accuracy is +/−0.68% (2σ).

While the present invention has been illustrated and described with reference to specific embodiments, further modifications and improvements will occur to those skilled in the art. It is to be understood, therefore, that this invention is not limited to the particular forms illustrated, for example, other types of filters or tuning algorithms could be used. It is intended that these claims cover all modifications that do not depart from the spirit and scope of this invention.

We claim:

1. A method of tuning an analog filter comprising:
    a) filtering an input signal with the analog filter to produce a filtered signal, the input signal being such that the filtered signal has a frequency response representative of that of the analog filter;
    b) performing an analog-to-digital conversion on the filtered signal to produce digital filtered signal samples;
    c) processing the digital filtered signal samples to determine at least one characterizing filter parameter;
    d) adjusting the analog filter based on the analog at least one characterizing filter parameter; and
    e) providing the input signal with substantially flat spectral density
    f) repeatedly performing steps (a) through (e) until the characterizing filter parameters satisfies at least one objective.

2. The method according to claim 1 further comprising:
    g) disconnecting a normal input to the analog filter, and connecting the analog filter to the input signal with the substantially flat spectral density.

3. The method according to claim 2 further comprising:
    h) performing an amplification prior to performing the analog-to-digital conversion.

4. The method according to claim 1 wherein the at least one characterizing filter parameter comprises at least a center frequency (Fc) and a Quality factor (Q).

5. The method according to claim 4 further comprising:
    g) repeatedly performing steps (a) through (e) until the center frequency and Q satisfy at least one objective.

6. The method according to claim 5 wherein the at least one objective comprises a respective predetermined range within which each characterizing filter parameter must fall.

7. The method according to claim 2 wherein the at least one objective comprises a respective predetermined range within which each characterizing filter parameter must fall.

8. The method according to claim 1 adapted to tune the filter periodically, the method comprising:
    i) performing steps a) through f); and
    ii) disabling the method,
wherein steps i) and ii) are performed at a predetermined update rate.

9. The method according to claim 1 adapted to tune the filter periodically, the method comprising:
    i) performing steps a) through f); and
    ii) disabling the method,
wherein steps i) and ii) are performed continuously.

10. The method according to claim 1 wherein the filter is an on-chip Q enhanced LC bandpass filter.

11. The method of tuning a multi-stage analog filter comprising:
    a) setting characterizing parameters of all filter stages of the multi-stage analog filter to default values;
    b) filtering an input signal with a specified filter stage of the multi-stage analog filter to produce a filtered signal, the input signal being such that the filtered signal has a frequency response representative of that of the multi-stage analog filter;
    c) performing analog-to-digital conversion on the filtered signal to produce filtered signal digital samples;
    d) processing the filtered signal digital samples to determine at least one characterizing filter parameter of the specified filter stage;
    e) adjusting the specified filter stage based on the at least one characterizing filter parameter; and
    f) repeating steps b) through e) to adjust the at least one characterizing filter parameter of a subsequent each other filter stage of the multi-stage analog filter.

12. An apparatus comprising:
    an analog filter adapted to filter an input signal to produce a filtered signal, the input signal being such that the filtered signal has a frequency response representative of that of the analog filter;
    an analog-to-digital converter adapted to sample the filtered signal to produce filtered signal digital samples;
    a digital circuit adapted to process the filtered signal digital samples to determine at least one characterizing filter parameter and to adjust the filter based on the at least one characterizing filter parameter, wherein the input signal has a substantially flat spectral density wherein the apparatus is adapted to repeatedly adjust the filter until each characterizing filter parameter satisfies at least one objective.

13. The apparatus according to claim 12 further comprising:
   a switch for disconnecting a normal input to the filter, and connecting the filter to an input signal with a substantially flat spectral density.

14. The apparatus according to claim 12 further comprising:
   an amplifier adapted to amplify the filtered signal prior to performing analog-to-digital conversion.

15. The apparatus according to claim 12 wherein the at least one characterizing filter parameter comprises a center frequency and (Fc) and a Quality factor (Q).

16. The apparatus according to claim 12 adapted to adjust the filter until each characterizing filter parameter falls within a respective predetermined range, after which no updating is performed until an update period has passed.

17. The apparatus according to claim 12 wherein the filter is a high Q bandpass filter.

18. The apparatus according to claim 12 wherein the filter is an on-chip Q enhanced LC bandpass filter.

19. The apparatus according to claim 12 wherein the ADC is adapted to sub-sample the filter output with a bandwidth at least as great as a bandwidth of interest of the filter.

* * * * *

UNITED STATES PATENT AND TRADEMARK OFFICE
CERTIFICATE OF CORRECTION

PATENT NO. : 6,983,136 B2
APPLICATION NO. : 10/244558
DATED : January 3, 2006
INVENTOR(S) : Ralph Mason and Chris Devries It is certified that error appears in the above-identified patent and that said Letters Patent is hereby corrected as shown below:

Title Page: Item (73), Assignee: Change "Eno" to --Enq--.

Signed and Sealed this

Twenty-sixth Day of June, 2007

JON W. DUDAS
*Director of the United States Patent and Trademark Office*